US 6,888,866 B2
May 3, 2005

(12) United States Patent
Kuniyasu et al.

(54) SEMICONDUCTOR LASER DEVICE WITH A CURRENT NON-INJECTION REGION NEAR A RESONATOR END FACE, AND FABRICATION METHOD THEREOF

(75) Inventors: Toshiaki Kuniyasu, Kaisei-machi (JP); Fusao Yamanaka, Kaisei-machi (JP); Toshiaki Fukunaga, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 153 days.

(21) Appl. No.: 09/973,814

(22) Filed: Oct. 11, 2001

(65) Prior Publication Data
US 2002/0061044 A1 May 23, 2002

(30) Foreign Application Priority Data

Oct. 12, 2000 (JP) .................................. 2000-311405
Nov. 28, 2000 (JP) .................................. 2000-360432
Feb. 15, 2001 (JP) .................................. 2001-038689

(51) Int. Cl.$^7$ ................................................ H01S 5/00
(52) U.S. Cl. .......................................... 372/45; 372/46
(58) Field of Search ............................ 372/44, 45, 46, 372/49, 50, 43, 75, 96, 97

(56) References Cited

U.S. PATENT DOCUMENTS

| 4,282,494 | A | * | 8/1981 | Yonezu et al. ................ 372/46 |
| 4,371,966 | A | * | 2/1983 | Scifres et al. ................. 372/45 |
| 5,394,421 | A | | 2/1995 | Ikawa et al. |
| 5,960,020 | A | * | 9/1999 | Nagai ............................ 372/46 |
| 6,127,691 | A | * | 10/2000 | Fukunaga et al. ............. 257/17 |
| 6,285,695 | B1 | * | 9/2001 | Asano et al. .................. 372/45 |
| 6,396,863 | B1 | * | 5/2002 | Fukunaga ...................... 372/46 |
| 6,400,743 | B1 | * | 6/2002 | Fukunaga et al. ............. 372/46 |
| 6,516,016 | B1 | * | 2/2003 | Fukunaga et al. ............. 372/45 |
| 6,546,033 | B2 | * | 4/2003 | Fukunaga ...................... 372/45 |
| 6,580,738 | B2 | * | 6/2003 | Fukunaga ...................... 372/46 |

FOREIGN PATENT DOCUMENTS

| EP | 03-222488 | 10/1991 |
| EP | 0 845 841 A2 A3 | 6/1998 |
| EP | 0 920 096 A2 | 6/1999 |
| JP | 63-038279 | 2/1988 |
| JP | 05-327112 | 12/1993 |
| JP | 09-298340 | 11/1997 |
| JP | 11-220224 | 8/1999 |
| JP | 11-354880 | 12/1999 |

OTHER PUBLICATIONS

Horie et al. "Thermal Rollover Characteristics Up to 150 C of Buried-Stripe Type 980-nm Laser Diodes with a Current Injection Window Delinated by a SiN Layer", IEEE Photonics Techonology Letters, vol. 12, No. 1. Jan 2000.*

(Continued)

Primary Examiner—Minsun Oh Harvey
Assistant Examiner—Tuan N. Nguyen
(74) Attorney, Agent, or Firm—Sughrue Mion, PLLC

(57) ABSTRACT

An n-GaAs buffer layer, an n-AlGaAs lower cladding layer, an n- or i-InGaP lower optical waveguide layer, an InGaAsP quantum cell active layer, a p- or i-InGaP upper optical waveguide layer, a p-AlGaAs first upper cladding layer, a p- or i-InGaP etch-stopping layer, a p-AlGaAs second upper cladding layer, and a p-GaAs contact layer, are grown upon an n-GaAs substrate. A photoresist is coated on the wafer, and two grooves are formed by etching. Then, the photoresist on the perimeter of the device is removed and the contact layer is selectively etched. Next, the photoresist is lifted off. A $SiO_2$ film is formed on the entire surface. After a window is formed in a portion of the $SiO_2$ film corresponding to a ridge portion, a p-electrode is formed on a region of the $SiO_2$ film other than the device perimeter.

16 Claims, 5 Drawing Sheets

OTHER PUBLICATIONS

Toshiaki Fukunaga et al. High–power 0.8 um InGaAs/InGaP/AlGaAs Single Quantum Well Lasers with Tensile–strained InGaP Barriers XP 001096289, Japanese Journal of Applied Physics. vol. 38, No. 4A. Apr. 1, 1999.*

Patent Abstracts of Japan, vol. 2000, No. 07, 2000101198, Apr. 7, 2000.

M. Sagawa et al. "Highly reliable operation of high–power 0.98–$\mu$m InGaAs/InGaAsP lasers with a window structure fabricated by Si implantation", Semiconductor Laser Conference, 1998 IEEE 16$^{th}$ International Nara, Oct. 4, 1998.

S. Rusli et al. "1 W CW reliable $\lambda$=730nm aluminuim–free active layer diode laser", Electronics Letters, vol. 36, No. 7, Mar. 30, 2004.

Toshiaki Fukunaga et al.. High–Power 0.8 $\mu$m InGaAsP/InGaP/AlGaAs Single Quantum Well Lasers with Tensile–Strained InGaP Barriers XP 001096289, Japanese Journal of Applied Physics, vol. 38, No. 4A, Apr. 1, 1999.

Fukunaga, et al "High–Power 0.8 $\mu$m InGaAsP/InGaP/A 1 GaAs Single Quantum Well :Lasers with Tensile–Strained InGaP Barriers" Jpn. J. Appl. Phys. vol.38 (1999) pp. L387–L389 Part 2, No. 4A, Apr. 1, 1999.

Horie, et al "Thermal Rollover Characteristics Up to 150° C of Buiried–Stripe Type 980–nm Laser Diodes with a Current Injection Window Delineated by a SiN$_x$Layer" IEEE Photonics Technology Letters, vol. 12, No. 1 , Jan. 2000, pp. 13–15..

* cited by examiner

SEMICONDUCTOR LASER DEVICE WITH A CURRENT NON-INJECTION REGION NEAR A RESONATOR END FACE, AND FABRICATION METHOD THEREOF

BACKGROUND OF THE INVENTION

1. Field of the Invention

The present invention relates to a semiconductor laser device equipped with a current non-injection region near a resonator end face, a fabrication method thereof, and a solid-state laser apparatus equipped with the semiconductor laser device.

2. Description of the Related Art

In semiconductor laser devices, the current density at the end face is increased under high-output emission, so that non-emission recombinant current increases and end-face destruction, etc., occur. Because of this, it is difficult to obtain high device reliability.

To solve the problem mentioned above, a variety of structures for forming a current non-injection region near the resonator end face have been proposed. For example, there is a semiconductor laser device which has a current non-injection region by not forming an electrode near the end portion of the contact layer (IEEE Phonics Technology Letters, vol. 12, No. 1, January 2000, p 13–15). However, in this structure, the current non-injection at the device end face is incomplete because spreading of current through the contact layer occurs near the end face. Japanese Unexamined Patent Publication No. 11(1999)-354880 discloses another semiconductor laser device. In this semiconductor laser device, an etch-stopping layer and a contact layer are stacked on a cladding layer, and a portion of the contact layer near the end face is removed until the etch-stopping layer is exposed. An electrode extending to the end face is formed on the etch-stopping layer. Since the electrode near the end face is in contact with the etch-stopping layer, the current non-injection at the end face is incomplete. Japanese Patent Application No. 2000-311405 (filed by the present applicant) discloses a ridge-structure semiconductor laser device having a current non-injection structure near a resonator end face, and a fabrication method thereof. Japanese Patent Application No. 2000-253518 discloses a current-constriction-structure semiconductor laser device having a current non-injection structure near a resonator end face, and a fabrication method thereof.

On the other hand, a multiplicity of structures have been proposed to make the bandgap energy at a resonator end face larger so that emitted light is not absorbed. For instance, a semiconductor laser device with InGaAsP tensile strain barrier layers is disclosed in Japanese Unexamined Patent Publication No. 11(1999)-220224 and JJAP, vol. 38, pp. L387–389, No. 4A, 1999. The InGaAsP tensile strain barrier layers are formed on the top and bottom surfaces of an InGaAs active layer. With this structure, lattice relaxation occurs in the active layer near the light-exit end face, the bandgap is increased, and the light absorption at the light-exit end face is reduced. This reduces reactive current that can be the cause of heat generation.

In the case where the aforementioned current non-injection region is formed in a semiconductor laser device having a ridge structure, the step of forming grooves and the step of removing a portion of the contact layer to form a current non-injection region must be performed, which is troublesome and time-consuming. In addition, the photoresist material, applied by spin coating, is formed thicker in the etching grooves than on the flat portions and is hardened by an $NH_3:H_2O_2$ mixed water solution that selectively etches the contact layer. Due to this, when photo-lithographic etching is to be performed again after formation of the ridge grooves, the photoresist lift-off performance deteriorates and some photoresist material remains in the grooves. If photoresist material remains, there is a problem that the unremoved photoresist will contaminate the grooves, thereby reducing the adhesion of the insulating film thereto and that a hollow, etc., will be formed in the subsequent electrode-sinter heat treatment step, etc., which will reduce heat radiation performance during laser emission. Furthermore, there is a problem that after formation of the grooves, the side face of a layer exposed to the groove for a long period of time will be oxidized, increasing crystal defects, which stops laser emission. Particularly, in the case where the layer exposed to the groove is composed of AlGaAs, it is liable to be oxidized.

Hence, it is conceivable that the order of the ridge forming step and the contact-layer removing step is reversed and that the contact layer is first removed and then the grooves are formed. However, after a portion of the contact layer near the end face is removed, the cladding layer underneath the contact layer is oxidized. Because of this, there is a problem that reproducibility of the depth of groove etching will not be satisfactory. Since the groove depth determines an equivalent refractive index step difference $\Delta Neff$ related to the profile of laser light, it is undesirable to adopt a process where reproducibility is not obtained. In addition, the aforementioned barrier layer having tensile strain is not sufficient to enhance reliability under a higher output.

DISCLOSURE OF THE INVENTION

The present invention has been made in view of the circumstances mentioned above. Accordingly, it is an object of the present invention to provide a semiconductor laser device with an end-face current non-injection structure which is capable of obtaining high reliability in a range from a low output to a high output. Another object of the present invention is to provide a fabrication method that is capable of easily fabricating the semiconductor laser device with high throughput. Still another object is to provide a solid-state laser apparatus, equipped with the semiconductor laser device, which has high reliability under high-output laser emission.

To achieve the objects of the present invention mentioned above, there is provided a first semiconductor laser device comprising: (1) a substrate, a semiconductor layer including an active layer, a cladding layer, and a contact layer stacked in the recited order; (2) two exposed portions having a depth at which the semiconductor layer is exposed continuously from one of two resonator end faces to the other; and (3) a ridge portion, formed between the two exposed portions, which has a current injection window.

In at least one of the resonator end faces of the ridge portion, a portion of the contact layer near the one resonator end face is removed. The semiconductor laser device of the present invention also comprises an insulating film, which is formed so that it covers a portion, excluding the current injection window, of the contact layer, the cladding layer exposed by removing a portion of the contact layer near the one resonator end face, and the exposed portions. The semiconductor laser device further comprises an electrode, formed on at least a portion of the contact layer exposed to the current injection window.

In the semiconductor laser device of the present invention, the uppermost layer of the semiconductor layer in a stacking direction may be an etch-stopping layer. The cladding layer may be provided on the etch-stopping layer, and a layer exposed to bottom portions of the two exposed portions may be the etch-stopping layer.

In the semiconductor laser device of the present invention, the cladding layer may comprise AlGaAs and the contact layer may comprise GaAs. In addition, the etch-stopping layer may comprise InGaP.

In a preferred form of the present invention, the cladding layer comprises AlGaAs, the contact layer comprises GaAs, and the etch-stopping layer comprises InGaP.

In another preferred form of the present invention, a second cladding layer is provided underneath the etch-stopping layer. The second cladding layer is the same in conductivity and nearly the same in refractive index as the cladding layer, and has a lattice match with respect to the substrate. In the case where the second cladding layer is not provided, and the underlying layer of the etch-stopping layer is an optical waveguide layer, it is preferable that this optical waveguide comprise InGaP.

In the semiconductor laser device of the present invention, a side face of the contact layer exposed to the exposed portion is situated inside an edge of the top surface of the cladding layer exposed to the exposed portion. Also, a portion of the contact layer near the resonator end face, which is removed, is in a range between 5 $\mu$m and 50 $\mu$m, from the one resonator end face.

In accordance with the present invention, there is provided a method of fabricating a semiconductor laser device, comprising the steps of: (a) stacking a cladding layer and a contact layer on a semiconductor layer including an active layer, in the recited order; (b) forming a photoresist film, which has two windows extending from one of two resonator end faces to the other, on the contact layer through a mask, and then etching the cladding layer and the contact layer to form two grooves, corresponding to the two windows, and a ridge portion between the two grooves; (c) forming a window in at least a portion of the photoresist film near one of the two resonator end faces of the ridge portion through a mask, and then selectively etching and removing a portion of the contact layer which is near the one resonator end face; and (d) lifting off and removing the photoresist film.

In the fabrication method of the present invention, the cladding layer comprises AlGaAs and the contact layer comprises GaAs. In this case, it is desirable that the contact layer be etched with an $NH_3:H_2O_2$ mixed water solution.

A region where the contact layer is removed is the above-mentioned "at least one of the resonator end faces of the ridge portion." Therefore, the region may be the two resonator end faces, or may be not only the resonator end face of the ridge portion but also the resonator end face of the device. Furthermore, it may be the four side faces of the device. That is, a portion of the contact layer on the perimeter of the device may be removed.

In accordance with the present invention, there is provided a second semiconductor laser device comprising:

two opposite resonator end faces where at least a first conduction type first cladding layer; a first conduction type or i-type first optical waveguide layer; an i-type $In_{x2}Ga_{1-x2}As_{1-y2}P_{y2}$ first barrier layer having tensile strain (where x2/0.49$\leq$y2$\leq$0.3+(x2/0.49), and 0.8$\leq$y2$\leq$1.0); an i-type $In_{x3}Ga_{1-x3}As_{1-y3}P_y$ quantum cell active layer (where 0.3$\leq$x3$\leq$0.2 and y3=x3/0.49); an i-type $In_{x2}Ga_{1-x2}As_{1-y2}P_{y2}$ second barrier layer having tensile strain (where x2/0.49$\leq$y2$\leq$0.3+(x2/0.49), and 0.8$\leq$y2$\leq$1.0); a second conduction type or i-type second optical waveguide layer; a second conduction type second cladding layer; and a second conduction type contact layer. These layers are stacked on a first conduction type GaAs substrate in the recited order. The first cladding layer and the second cladding layer comprise compositions which have a lattice match with respect to the GaAs substrate, respectively. The first optical waveguide layer and the second optical waveguide layer comprise compositions which have a lattice match with respect to the GaAs substrate, respectively. The total thickness of the first barrier layer and the second barrier layer is between 10 nm and 30 nm. The first barrier layer and the second barrier layer have tensile strains with respect to the GaAs substrate, respectively, and comprise a composition in which the product of a tensile strain quantity common to the two barrier layers and the total thickness is between 0.05 nm and 0.2 nm. The quantum cell active layer comprises a composition which has a lattice match with respect to the GaAs substrate or composition which has a tensile strain of up to 0.007 with respect to the substrate. Furthermore, a current non-injection region is provided near at least one of the two opposite resonator end faces.

In a preferred form of the second semiconductor laser device of the present invention, the current non-injection region is formed by removing at least a portion of the contact layer that is near the one resonator end face. In addition, an insulating film is formed from the remaining contact layer on the second cladding layer to the second cladding layer exposed to the current non-injection region, and a current injection window is formed by removing a portion of the insulating film to inject current. Furthermore, an electrode is formed on a portion of the insulating film other than the current non-injection region so that it covers at least the current injection window.

In a preferred form of the second semiconductor laser device of the present invention, the contact layer comprises GaAs and the cladding layer has a composition that is not etched by an etchant for GaAs.

In a preferred form of the second semiconductor laser device of the present invention, the current non-injection region is formed in a range between 5 $\mu$m and 50 $\mu$m, from the resonator end face.

In the second semiconductor laser device of the present invention, a region where the contact layer is removed is the above-mentioned "at least one of the resonator end faces of the ridge portion." The expression "at least one of the resonator end faces of the ridge portion" is intended to mean that the region may be the two resonator end faces, or may be not only the resonator end face of the ridge portion but also the resonator end face of the device. Furthermore, it may be the four side faces of the device. That is, a portion of the contact layer on the perimeter of the device may be removed.

In addition, the aforementioned "tensile strain quantity common to the two barrier layers" is strain with respect to the GaAs substrate. Assuming the lattice constant of the GaAs substrate is $a_{GaAs}$ and that the lattice constant of the barrier layer is $a_1$, the tensile strain quantity $\Delta_1$ is expressed as $\Delta_1=(a_{GaAs}-a_1)/a_{GaAs}$. The tensile strain quantity $\Delta_1$ in the present invention is 0.003<$\Delta_1$<0.01.

Similarly, assuming the lattice constant of the active layer is $a_2$, the tensile strain quantity $\Delta_2$ of the active layer is expressed as $\Delta_2=(a_{GaAs}-a_2)/a_{GaAs}$. The "lattice match" used herein means that $\Delta_2$ is $-0.003\leq\Delta_2\leq0.003$. As described above, the quantum cell active layer comprises a composition which has a lattice match with respect to the GaAs substrate or composition which has a tensile strain of up to 0.007 with respect to the substrate. The composition in the active layer satisfies $-0.003 \leq \Delta_2 \leq 0.007$.

In accordance with the present invention, there is provided a solid-state laser apparatus comprising: an excitation light source; and a solid-state laser crystal for emitting laser light by being excited with excitation light emitted from the excitation light source; wherein the excitation light source comprises the semiconductor laser device described above.

Note that the first conduction type and the second conduction type have opposite polarities. For instance, if the first conduction is a p-type, the second conduction type is an n-type.

According to the first semiconductor laser device of the present invention mentioned above, a portion of the contact layer near the resonator end face is removed and an insulating film is formed on the exposed layer. Therefore, since current is not injected near the optical resonator end face, the current density at the end face can be reduced and the generation of heat at the end face can be reduced. Thus, the first semiconductor laser device of the present invention is capable of suppressing end-face destruction due to a rise in the heat generation caused by non-emission recombination current and is therefore capable of obtaining a laser light beam whose reliability is high from a low output to a high output.

In the first semiconductor laser device of the present invention, the uppermost layer of the semiconductor layer in a stacking direction is an etch-stopping layer, and a cladding layer is provided on the etch-stopping layer. With this arrangement, etching for forming grooves can be precisely stopped and the groove width can be controlled with a high degree of accuracy.

When the cladding layer comprises AlGaAs and the contact layer comprises GaAs, an $NH_3:H_2O_2$ mixed water solution is selected as the etchant. This makes it possible to etch only the contact layer selectively.

If the etch-stopping layer comprises InGaP, and the overlying layer comprises InGaP which has selectivity, etching can be precisely stopped at the etch-stopping layer. Particularly, in the case where the cladding layer comprises AlGaAs and the contact layer comprises GaAs, selectivity is high.

In the first semiconductor laser device of the present invention, a side face of the contact layer exposed to the exposed portion is situated inside the top edge of the side face of the cladding layer exposed to the exposed portion. With this arrangement, coverage of the groove side faces by the insulating film is improved.

In the first semiconductor laser device of the present invention, it is preferable that the portion of the contact layer near the resonator end face, which is removed, is in a range between 5 μm and 50 μm, from the one resonator end face. If the range is less than 5 μm, it is extremely difficult to form a current non-injection region because of spreading of current caused by the contact layer. As a result, end-face degradation occurs due to generation of heat. If it is greater than 50 μm, the current non-injection region absorbs light and increases light loss, resulting in a reduction in the light output.

According to the fabrication method of the present invention, a window for removing a portion of the contact layer near the end face is formed in the photoresist film used for forming grooves, and double exposure is performed. This prevents the hardening of the photoresist film within the groove and the oxidization of the groove side wall, previously described. Thus, the fabrication method of the present invention is capable of easily fabricating a non-injection region with good reproducibility and a high degree of accuracy, and is therefore capable of providing a semiconductor laser device whose reliability is high up to a high output.

In the fabrication method of the present invention, when the cladding layer comprises AlGaAs and the contact layer comprises GaAs, the contact layer is etched with an $NH_3:H_2O_2$ mixed water solution. This renders it possible to etch only the contact layer selectively.

According to the second semiconductor laser device of the present invention, InGaAsP tensile strain barrier layers are provided on the top surface and bottom surface of an InGaAsP active layer. With this arrangement, the amount of tensile stress from the tensile strain barrier layers near the end face is reduced by cleavage, and lattice relaxation occurs. As a result, the bandgap near the end face is increased, and the light absorption at the light-exit end face can be reduced. In addition, in the present invention, since a current non-injection region is formed on the end face, the light density at the end face is reduced, whereby generation of heat can be reduced. Furthermore, the light absorption at the light-exit end face can be reduced, so further enhancements in light output and reliability are achieved.

By providing the InGaAsP tensile strain barrier layer, the barrier height between the active layer and the barrier layer can be increased and the leakage of electrons and holes from the active layer to the optical waveguide layer can be reduced. This reduces the driving current. As a result, the generation of heat at the device end face can be reduced and the temperature dependency characteristics of the device can be improved. Therefore, the device reliability during high-output emission can be enhanced.

Since the active layer contains no aluminum (Al), the device has high durability compared with a conventional 0.8-μm-band semiconductor laser device containing Al in the active layer.

In the second semiconductor laser device of the present invention, a portion of the contact layer near the resonator end face is removed and an insulating film is formed on the exposed layer. Furthermore, no electrode is formed near the resonator end face. Therefore, since current is not injected near the optical resonator end face, the current density at the end face can be reduced and the generation of heat at the end face can be reduced. Thus, since end-face destruction due to an increase in the light density can be suppressed, a laser light beam whose reliability is high from a low output to a high output can be obtained.

In the second semiconductor laser device of the present invention, the contact layer comprises GaAs and the cladding layer has a composition that is not etched by an etchant for GaAs. Therefore, a portion of only the contact layer near the end face can be accurately removed.

In the second semiconductor laser device of the present invention, it is preferable that a portion of the contact layer near the resonator end face, which is removed, is in a range between 5 μm and 50 μm, from the one resonator end face. If the range is less than 5 μm, it is extremely difficult to form a current non-injection region because of spreading of current caused by the second conduction type GaAs contact layer. As a result, end-face degradation occurs due to generation of heat. If it is greater than 50 μm, the current non-injection region absorbs light and increases light loss, resulting in a reduction in the light output.

In the solid-state laser apparatus of the present invention, the excitation light source comprises the aforementioned first or second semiconductor laser device. Therefore, reliability under high-output emission is high.

BRIEF DESCRIPTION OF THE DRAWINGS

The present invention will be described in further detail with reference to the accompanying drawings wherein.

DESCRIPTION OF THE PREFERRED EMBODIMENTS

The embodiments of the present invention will hereinafter be described in detail with reference to the drawings.

A semiconductor laser device according to a first embodiment of the present invention will hereinafter be described along the fabrication process. Said fabrication process is shown in FIGS. 1A–1C.

Figure 1A:
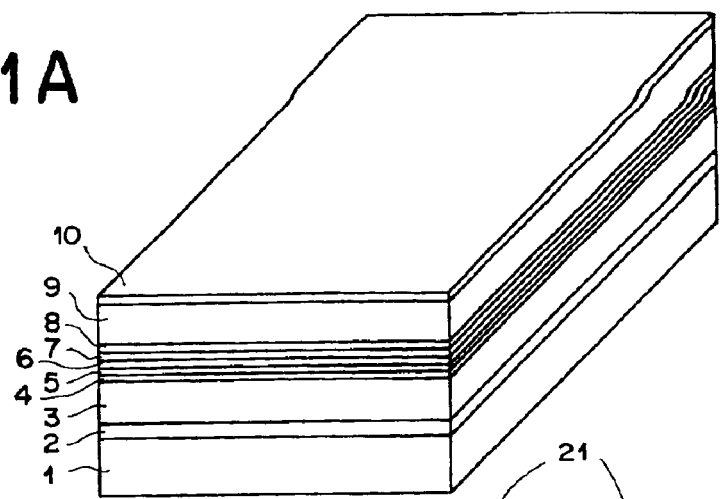
FIGS. 1A to 1C are perspective views showing how a semiconductor laser device according to a first embodiment of the present invention is fabricated.

As shown in FIG. 1A, an n-GaAs buffer layer 2, an n-$Al_{0.65}Ga_{0.35}As$ lower cladding layer 3, an n- or i-$In_{0.5}Ga_{0.5}P$ lower optical waveguide layer 4, an $In_{0.12}Ga_{0.88}As_{0.75}P_{0.25}$ quantum well active layer 5, a p- or i-$In_{0.5}Ga_{0.5}P$ upper optical waveguide layer 6, a p-$Al_{0.65}Ga_{0.35}As$ first upper cladding layer 7, a p- or i-$In_{0.5}Ga_{0.5}P$ etch-stopping layer 8, a p-$Al_{0.65}Ga_{0.35}As$ second upper cladding layer 9, and a p-GaAs contact layer 10, are grown epitaxially upon a (1.0.0)-plane n-GaAs substrate 1 by organometallic vapor phase epitaxy. The first upper cladding layer 7 is grown to a thickness such that an index guide wave can reach a high output at the waveguide in the groove of the center portion of the resonator.

Next, a photoresist film (not shown) is coated on the wafer, and a pre-exposure baking process (typically at 80 to 100° C.) is performed in a hot plate for 1. The wafer coated with the photoresist film is irradiated with an exposure of 100 mJ through a mask in which grooves 21 of 10 μm in width are formed with a space of 50 μm (see FIG. 2)so that they are parallel to the original flat plane of the (1.0.0)-plane substrate 1 and perpendicular to the laser cleavage plane. The irradiated regions of the photoresist film are dissolved in a developing solution, and windows are formed in the photoresist film.

Figure 1B:
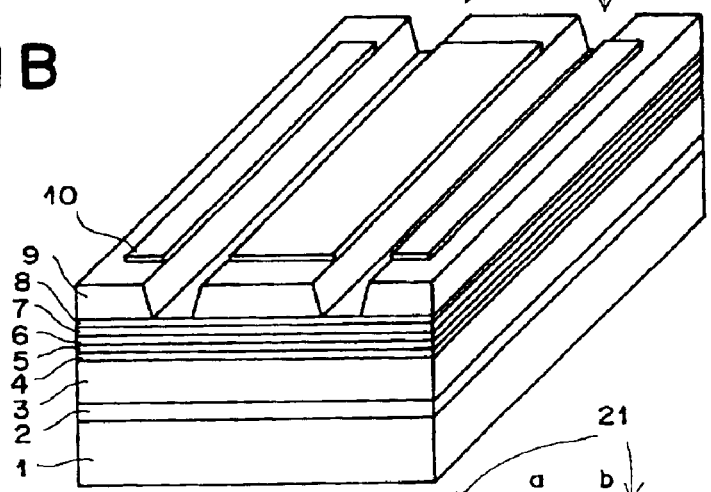
Figure 1C:
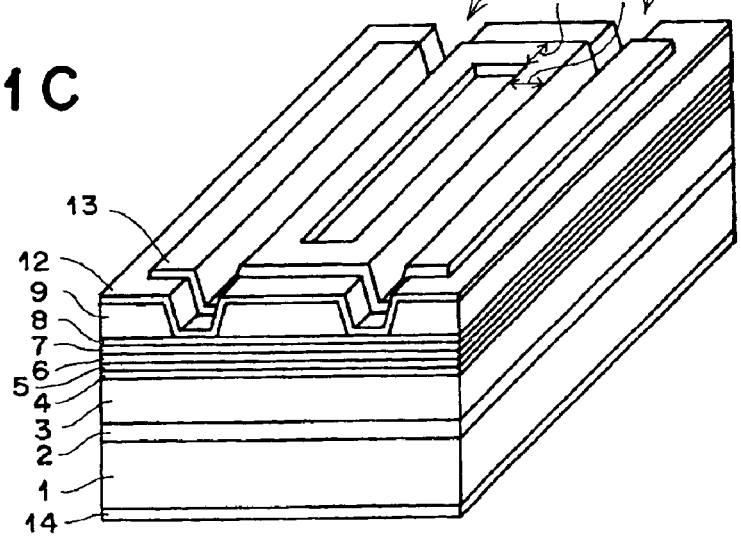

Next, as shown in FIG. 1B, the p-GaAs contact layer 10 and the p-$Al_{0.65}Ga_{0.35}As$ second upper cladding layer 9 are etched to form the grooves 21 with a tartaric etchant. The etching is automatically stopped at the InGaP etch-stopping layer 8.

Figure 2:
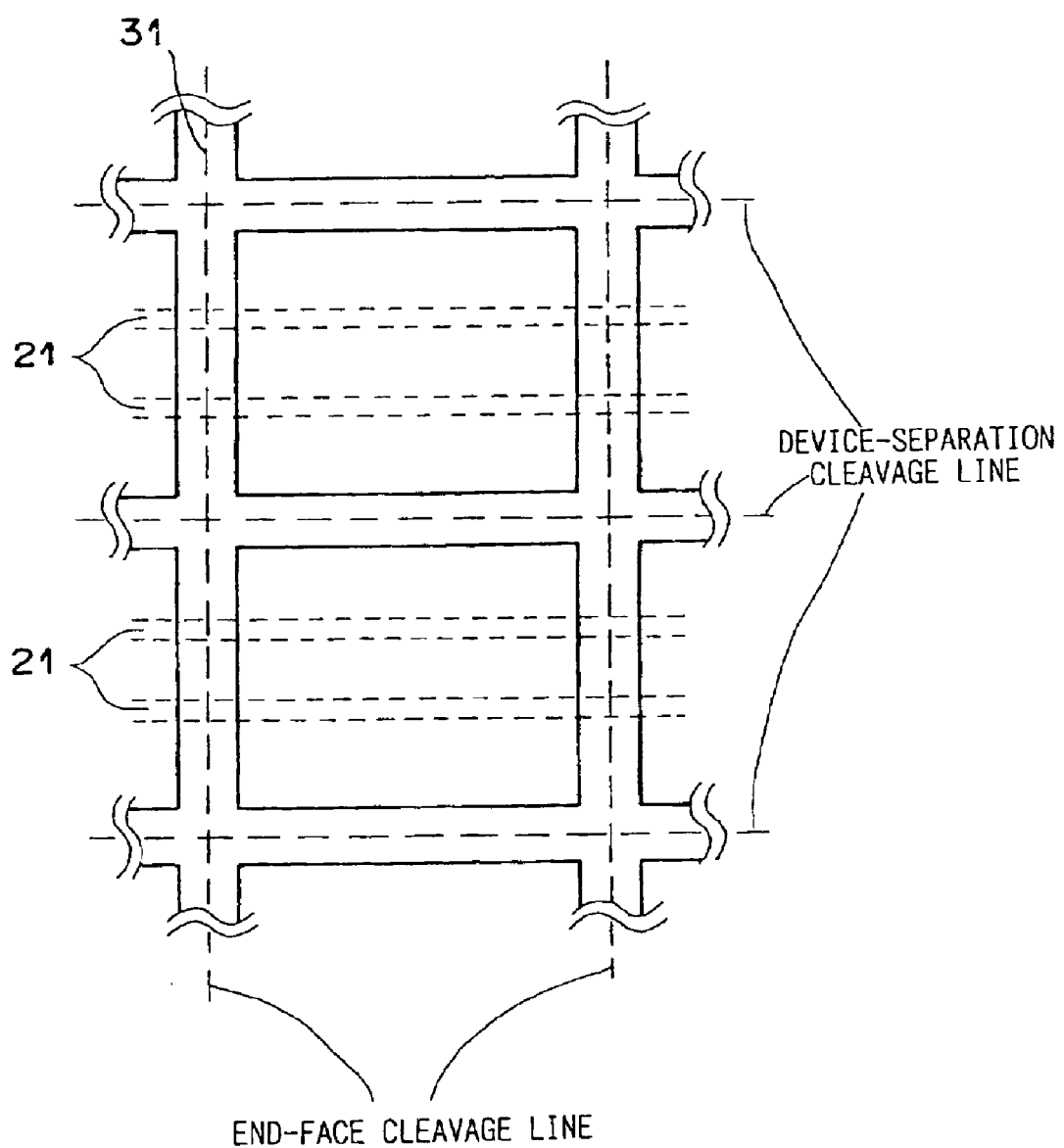
FIG. 2 is a plan view of mask alignment for forming a non-injection region.

Next, as shown in FIG. 2, a photomask to expose non-injection regions 31 is aligned with the wafer so that the non-injection regions 31 are evenly disposed on the end-face cleavage lines and the separation cleavage lines of the device. The wafer is irradiated with an exposure of 100 mJ. Next, the irradiated regions of the photoresist film are dissolved in a developing solution, and the non-injection regions 31 are formed in the photoresist film. The wafer is immersed for 10 seconds in a mixed water solution with a 1:50 volume ratio of $NH_3:H_2O_2$ at room temperature, and portions of the p-GaAs contact layer 10 corresponding to the non-injection regions 31 are selectively etched. When the p-GaAs contact layer 10 is etched, the side face of the p-GaAs contact layer 10 exposed to the groove 21 is situated inside the top edge of the groove 21. The photoresist film is dissolved in organic lye.

As shown in FIG. 1C, a 150-nm $SiO_2$ insulating film 12 is formed by a plasma-assisted chemical vapor deposition (PCVD) apparatus. Since the side face of the p-GaAs contact layer 10 exposed to the groove 21 is situated inside the top edge of the groove 21, coverage by the insulating film 12 becomes satisfactory. Next, a photoresist film is coated on the $SiO_2$ insulating film 12, and a photomask, having a window in a region 3 μm (indicated by a in the figure) away from the transverse edge of the 50-μm-wide ridge portion and 3 μm (indicated by b in the figure) away from the longitudinal edge of the ridge portion, is stacked on the wafer. In this state, ultraviolet rays are irradiated to the photomask with an exposure of 100 mJ. The irradiated region of the photoresist film is dissolved in a developing solution to form the window. After a portion of the $SiO_2$ insulating film 12 corresponding to the window is dissolved in a BHF solution, the photoresist film is dissolved in organic lye. With the lift-off technique, a p-electrode 13 is formed in a region excluding both the non-injection regions and regions near the device-separation cleavage lines.

When etching the p-GaAs contact layer 10, the side face of the p-GaAs contact layer 10 exposed to the groove 21 is situated inside the top edge of the groove 21. Therefore, similarly, coverage by the p-electrode 13 (which is stacked on the $SiO_2$ insulating film 12) becomes satisfactory.

Thereafter, the substrate 1 is polished and an n-electrode 14 is formed on the bottom surface of the substrate 1. After that, the wafer is cleaved at both-end-face setting positions (end-face cleavage lines shown in FIG. 2) to form a plurality of laser array bars. The resonator end faces of each laser array bar are provided with a high reflective coating and a low reflective coating, respectively. The laser array bar is cleaved along the device-separation cleavage lines (see FIG. 2) into laser devices, and each laser device is bonded on a heat sink with an In (indium) soldering material so that the p-plane of the device contacts the heat sink.

According to the semiconductor laser device of the first embodiment, a portion of the contact layer 10 on the perimeter of the device has been removed. There are cases where the insulating film 12 is peeled off as the laser array bar is cleaved. Even if the current conduction between the heat sink and the insulating film 12 occurs in the peeled region through the soldering material, when the p-plane of the device is bonded to the heat sink with the junction down, ohmic contact is not made and therefore no current flows, because the contact layer 10 has been removed. Even if the p-electrode 13 is peeled off together with the insulating film 12, hangs over the device side face, and makes contact with the n-type conductive layer of the device, there is an advantage that a short circuit is less likely to occur between them, as with the aforementioned case.

In the first embodiment, a n-type GaAs substrate has been employed. However, a p-type conductive substrate may be employed. In this case, the conductivity of each layer is reversed. As a growth method for each layer, a molecular beam epitaxial growth method employing solid matter or gas may be employed.

The width (light-emitting width) of the ridge portion is not limited to 50 μm, but may be any width. Also, the width of the U-shaped groove 21 is not limited to 10 μm. For example, the U-shaped groove 21 may be a straight-walled groove so that the maximum width is obtained.

The non-injection region (i.e., a region from which the contact layer 10 is removed) is situated between 5 μm and 50 μm, from the cleavage plane. Also, the non-injection region does not have to be formed along the perimeter of the device, as shown in the first embodiment. It may be formed only in a light-emitting region (ridge portion), or may be formed in one end face, not both end faces.

The insulating film 12 may be formed by a deposition method other than a PCVD method. In addition, the material is not limited to $SiO_2$. Any insulating material can be employed if it has processability. For instance, SiN may be employed. In the case of SiN, the film quality is finer and therefore leakage current due to defects can be reduced. As a result, an enhancement in throughput is expected.

In the first embodiment, the p-electrode 13 has not been formed in the non-injection region. However, since the insulating film 12 is formed in the non-injection region, there is no possibility that current will be injected. Therefore, the p-electrode 13 may be formed on the insulating film 12.

A semiconductor laser device according to a second embodiment of the present invention will hereinafter be described along the fabrication method. A sectional view thereof up to the contact layer is shown in FIG. 3, and a perspective view thereof after electrode formation is shown in FIG. 4.

Figure 3:
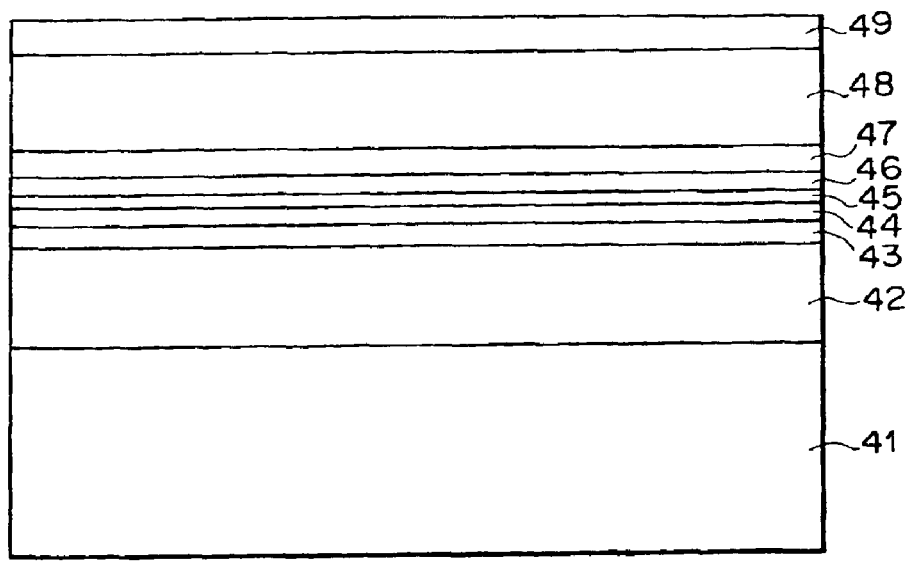
FIG. 3 is a sectional view showing the layer structure of part of a semiconductor laser device constructed according to a second embodiment of the present invention.
Figure 4:
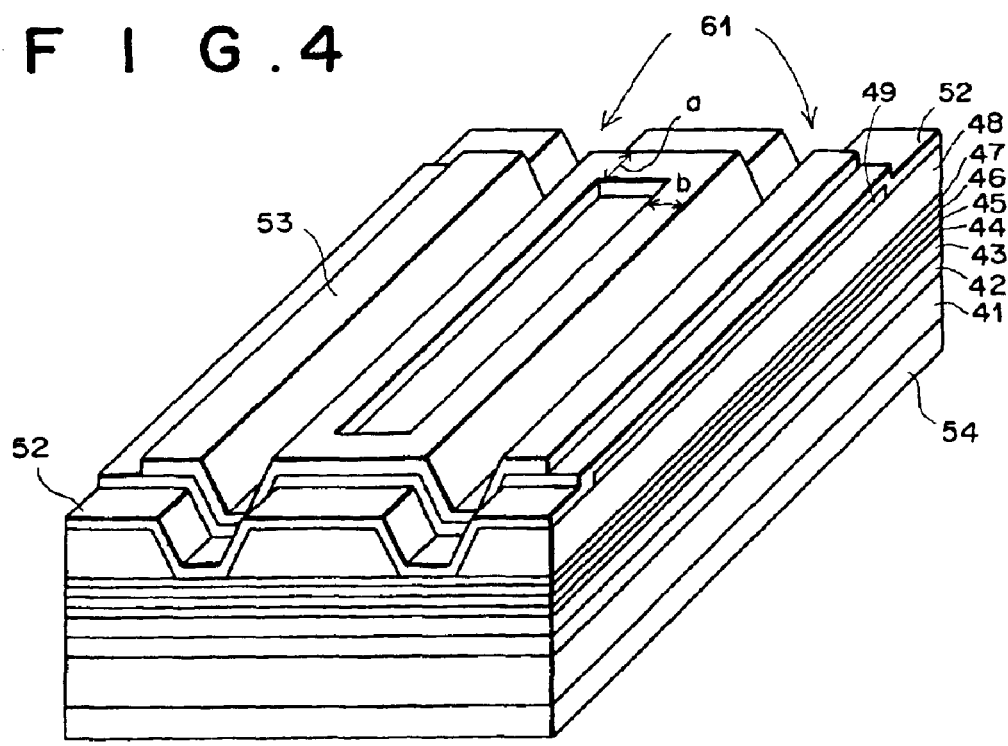
FIG. 4 is a perspective view showing the semiconductor laser device of the second embodiment of the present invention.

As shown in FIG. 3, an n-$Ga_{0.39}Al_{0.61}As$ cladding layer 42, an n- or i-$In_{0.49}Ga_{0.51}P$ optical waveguide layer 43, an i-$In_{0.4}Ga_{0.6}P$ tensile strain barrier layer 44, an i-$In_{0.13}Ga_{0.87}As_{0.75}P_{0.25}$ quantum well active layer 45, an i-In $_{0.4}Ga_{0.6}P$ tensile strain barrier layer 46, a p- or i-$In_{0.49}Ga_{0.51}P$ optical waveguide layer 47, a p-$Ga_{0.39}Al_{0.61}As$ cladding layer 48, and a p-GaAs contact layer 49, are grown epitaxially upon a (1.0.0)-plane n-GaAs substrate 41 by organometallic vapor phase epitaxy. The upper and lower optical waveguide layers 43, 47 are 0.4 μm in thickness.

Next, a photoresist film (not shown) is coated on the wafer, and a pre-exposure baking process (typically at 80 to 100° C.) is performed in a hot plate for 1. Ultraviolet rays are irradiated to the photoresist film on the wafer with an exposure of 100 mJ through a mask such that grooves 61 of 10 μm in width are formed with a space of 50 μm so that they are parallel to the original flat plane of the (1.0.0)-plane substrate 41 and perpendicular to the laser cleavage plane. The irradiated regions of the photoresist film are dissolved in a developing solution, and windows are formed in the photoresist film. Next, the p-GaAs contact layer 49 and the $Ga_{0.39}Al_{0.61}As$ cladding layer 9 are etched to form the grooves 61 with a tartaric etchant.

Next, a photomask, for exposing portions of the photoresist film near the device end faces which are to become current non-injection regions, is aligned with the wafer so that the non-injection regions are disposed on the device end-face cleavage lines (see FIG. 2). The wafer is irradiated with an exposure of 100 mJ. Next, the irradiated regions of the photoresist film are dissolved in a developing solution, and the non-injection regions are formed in the photoresist film. The wafer is immersed for 10 seconds in a mixed water solution with a 1:50 volume ratio of $NH_3$:$H_2O_2$ at room temperature, and portions of the p-GaAs contact layer 49 corresponding to the non-injection regions are selectively etched to form current non-injection portions. After the photoresist film is dissolved in organic lye, a 150-nm $SiO_2$ insulating film 52 is formed by plasma-assisted chemical vapor deposition (PCVD). In etching the p-GaAs contact layer 49, the side face of the p-GaAs contact layer 49 exposed to the groove is situated inside the top edge of the groove. Therefore, coverage by the insulating film 52 becomes satisfactory.

Next, a photoresist film is coated on the $SiO_2$ insulating film 52, and a photomask, having a window in a region 3 μm (indicated by a in FIG. 4) away from the transverse edge of the 50-μm-wide ridge portion and 3 μm (indicated by b in FIG. 4) away from the longitudinal edge of the ridge portion, is stacked on the wafer. In this state, ultraviolet rays are irradiated with an exposure of 100 mJ. The irradiated region of the photoresist film is dissolved in a developing solution to form the window. After a portion of the $SiO_2$ insulating film 52 corresponding to the window is dissolved in a BHF solution, the photoresist film is dissolved in organic lye. With the lift-off technique, a p-electrode 53 is formed in a region other than the non-injection regions. Thereafter, the substrate 41 is polished and an n-electrode 54 is formed on the bottom surface of the substrate 41.

Next, the thus-fabricated wafer is cleaved into laser array bars having a transverse length (resonator length) of 1.5 mm and a longitudinal length of 10 to 20 mm so that the (1.0.0) plane is exposed to the air. The optical resonator end faces of each laser array bar are exposed. One of the two end faces is coated with a film employing $Al_2O_3$ so that it has a thickness equivalent to a reflection ratio of 6±1% (emission wavelength 809 nm). The other of the two end faces has a stacked structure of λ/4 oxide (e.g., $Al_2O_3/TiO_2/(SiO_2/TiO_2)^4$:$Al_2O_3$, $TiO_2$, $SiO_2$, $TiO_2$, $SiO_2$, $TiO_2$, $SiO_2$, $TiO_2$, $SiO_2$, and $TiO_2$ are stacked in the recited order from the cleavage plane), and the reflection ratio is 95% or greater. The laser array bar with the reflection-ratio control layers is cleaved into semiconductor laser devices at intervals of 500 to 600 μm so that each laser device has a transverse length of 500 to 600 μm and a longitudinal length (resonator length) of 1.5 mm.

Next, the aforementioned semiconductor laser device is bonded on a heat sink. The entire surface (Cu) of the heat sink is plated with Ni (thickness 5 μm). Furthermore, on the surface on which the device is bonded, Ni (50 to 150 nm), Pt (50 to 200 nm), and In (3.5 to 5.5 μm) are deposited in the recited order so that the area is at least 4 times the device area. This heat sink is heated in a temperature range of 180 to 220° C. to melt In (indium), and the p-plane of the device is bonded on the melted In.

Figure 5:
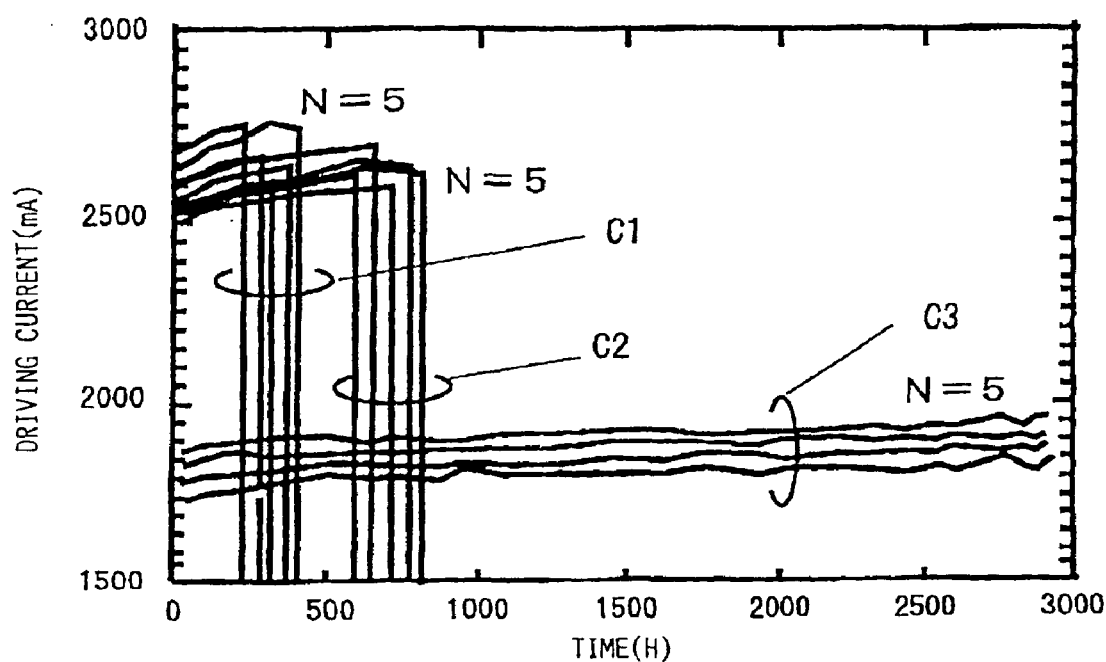
FIG. 5 is a graph of the time-lapse reliability of a semiconductor laser device as a comparative example.
Figure 6:
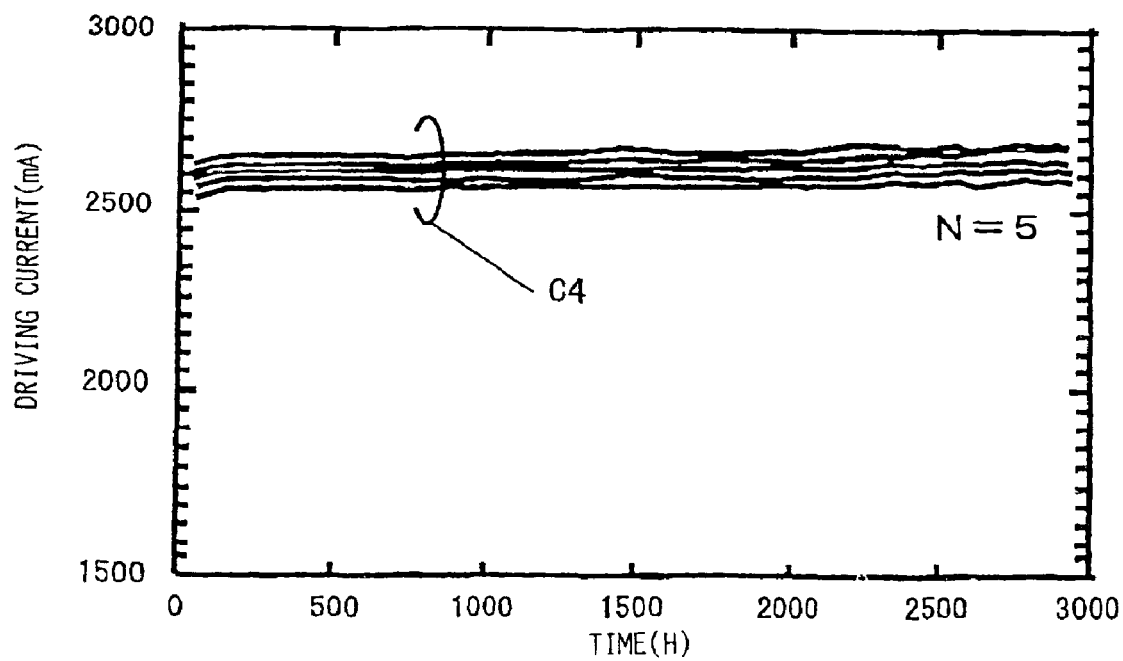
FIG. 6 is a graph showing the time-lapse reliability of the semiconductor laser device of the present invention.

The time-lapse reliability of the semiconductor laser device fabricated in the aforementioned manner was evaluated. The results of evaluation are shown in FIGS. 5 and 6. A device, which is the same as the aforementioned semiconductor laser device but has no end-face current non-injection region, was tested at an environmental temperature of 60° C. with an output of 1.5 W. The results are shown by C3 in FIG. 5. The same device was tested at an environmental temperature of 60° C. with an output of 2.0 W. The results are shown by C2 in FIG. 5. A device, which has an end-face current non-injection structure without the tensile strain barrier layer of the aforementioned semiconductor laser device, was tested at an environmental temperature of 60° C. with an output of 2.0 W. The results are shown by C1 in FIG. 5. Furthermore, the aforementioned semiconductor laser device of the present invention, provided with the tensile strain barrier layer and the end-face current non-injection region, was tested at an environmental temperature of 60° C. with an output of 2.0 W. The results are shown by C4 in FIG. 6. For each level, five devices were tested.

As shown by C3 in FIG. 5, the device with the tensile strain barrier layer and without the end-face current non-injection structure operates for about 3000 hours with an output of 1.5 W. However, if the output is increased to 2.0 W, the operation of the device ceases to operate after approximately 600 to 800 hours, as shown by C2 in FIG. 5. In addition, as shown by C1, in the device with the end-face current non-injection structure and without the tensile strain barrier layer, the operation ceases between after approximately 250 to 450 hours. Compared with these results, it is found, as shown by C4 in FIG. 6, that the device of the present invention with the tensile strain barrier layer and the end-face current non-injection structure operates for about 3000 hours with an output of 2.0 W. Therefore, by providing the InGaAsP tensile strain barrier layers 44, 46 on the top surface and bottom surface of the InGaAsP active layer 45 and further having the end-face current non-injection structure, a further enhancement in the output and high operating reliability can be obtained.

In the case where an end-face current non-injection region is formed in a semiconductor laser device having a ridge structure, the step of forming grooves and the step of removing a portion of the contact layer to form a current non-injection region must be performed, and consequently, there is a problem that the steps will be troublesome and time-consuming. In addition, the photoresist material, applied by spin coating, is formed thicker in the etching grooves than on the flat portions and is hardened by an $NH_3:H_2O_2$ mixed water solution that selectively etches the contact layer. Due to this, when photo-lithographic etching is to be performed again after formation of the ridge grooves, the photoresist lift-off performance deteriorates and some photoresist material remains in the grooves. Because of this, there is a problem that the unremoved photoresist will contaminate the grooves, thereby reducing the adhesion of the insulating film thereto and that a hollow, etc., will be formed in the subsequent electrode-sinter heat treatment step, etc., which will reduce heat radiation performance during laser emission. Furthermore, there is a problem that after formation of the grooves, the side face of a layer exposed to the groove for a long period of time will be oxidized, increasing crystal defects, which stops laser emission. As in the second embodiment, if the mask to form the grooves is not removed and is also employed to remove the contact layer so that the end-face has a current non-injection structure, the aforementioned reliability reduction can be prevented.

Next, a description will be given of a semiconductor laser device according to a third embodiment of the present invention. The semiconductor laser device of the third embodiment, as with the semiconductor laser device of the first embodiment, has a ridge structure in which grooves are formed in the p-type contact layer and the cladding layer underneath the contact layer. Therefore, a description will be made only of the layer structure.

In the semiconductor laser device of the third embodiment, an n-$Ga_{1-z1}Al_{z1}As$ cladding layer (where $0.55 \leq z1 \leq 0.7$), an n- or i-$In_{x1}Ga_{1-x1}As_{1-y1}P_{y1}$ optical waveguide layer (where $0.4 \leq x1 \leq 0.49$ and $y1=x1/0.49$), an i-$In_{x2}Ga_{1-x2}As_{1-y2}P_{y2}$ tensile strain barrier layer (where $x2/0.49 \leq y2 \leq 0.3+(x2/0.49)$, and $0.8 \leq y2 \leq 1.0$), an i-$In_{x3}Ga_{1-x3}As_{1-y3}P_y$ quantum well active layer (where $0.3 \leq x3 \leq 0.2$ and $y3=x3/0.49$), an i-$In_{x2}Ga_{1-x2}As_{1-y2}P_{y2}$ tensile strain barrier layer (where $x2/0.49 \leq y2 \leq 0.3+(x2/0.49)$, and $0.8 \leq y2 \leq 1.0$), a p- or i-$In_{x1}Ga_{1-x1}As_{1-y1}P_{y1}$ optical waveguide layer, a p-$Ga_{1-z1}Al_{z1}As$ cladding layer, and a p-GaAs contact layer, are stacked on an n-GaAs substrate in the recited order. Note that each cladding layer and each optical waveguide layer have composition ratios which have a lattice match with respect to the GaAs substrate, respectively. Also, a p-InGaP etch-stopping layer with a thickness of 10 nm may be provided anywhere in the p-$Ga_{1-z1}Al_{z1}As$ cladding layer.

In the second and third embodiments, the n-type GaAs substrate has been employed. However, a p-type conductive substrate may be employed. In this case, the conductivity of each layer is reversed. As a growth method for each layer, a molecular beam epitaxial growth method employing solid matter or gas may be employed.

The width (light-emitting width) of the ridge portion is not limited to 50 μm, but may be any width. Also, the width of the U-shaped groove 61 is not limited to 10 μm. For example, the U-shaped groove 61 may be a straight-walled groove so that the maximum width is obtained.

The area of the current non-injection region is between 5 μm and 50 μm from the cleavage plane. If the range is less than 5 μm, it is extremely difficult to form the current non-injection region because of spreading of current caused by the second conduction-type GaAs contact layer. As a result, end-face degradation occurs due to generation of heat. If it is greater than 50 μm, the current non-injection region absorbs light and increases light loss, resulting in a reduction in the light output. The non-injection region does not have to be formed along the perimeter of the device. It may be provided only on the light-emitting region (ridge portion), or may be provided on only one of the end-faces (light-exit end face), not both.

The insulating film 52 may be formed by a deposition method other than a PCVD method. In addition, the material is not limited to $SiO_2$. Any insulating material can be employed if it has processability.

A solid-state laser apparatus with the semiconductor laser device of the first embodiment as its excitation light source will hereinafter be described with reference to FIG. 7.

Figure 7:
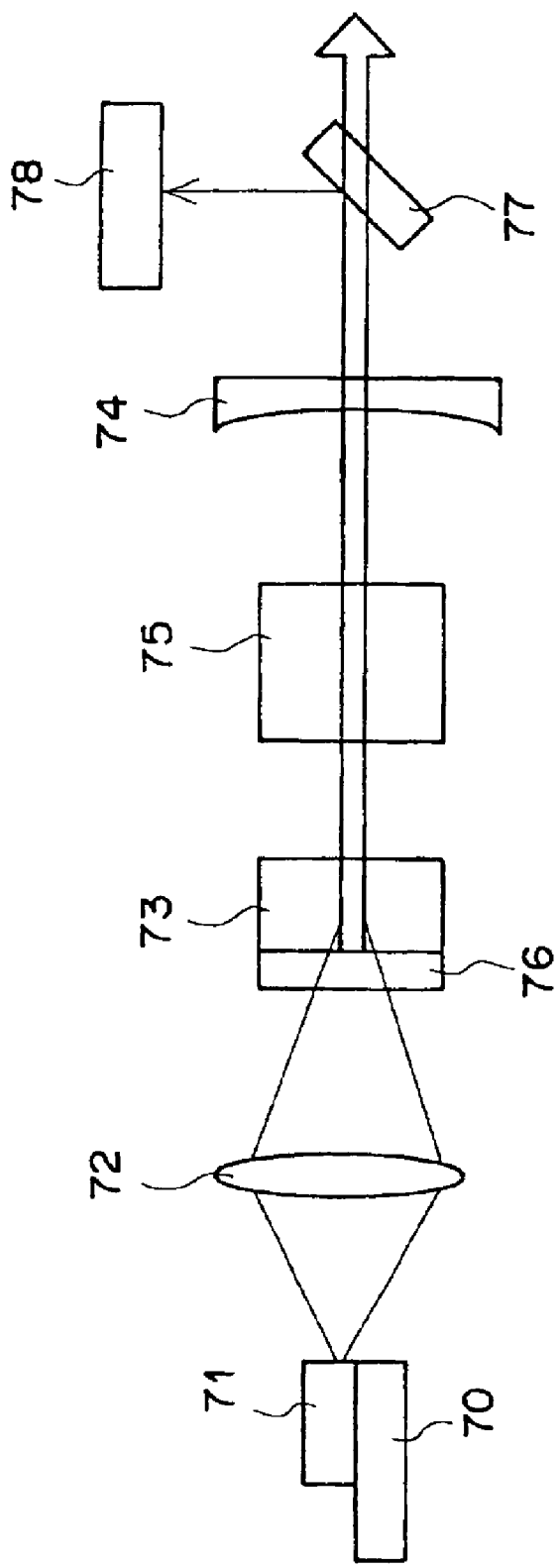
FIG. 7 is a schematic diagram showing a solid-state laser apparatus equipped with the semiconductor laser device of the present invention.

As shown in the FIG. 7, the solid-state laser apparatus is a solid-state laser apparatus making use of second harmonic generation. The high-output semiconductor laser device 71 of the first embodiment mounted on a heat sink 70 is used as an excitation light source. The solid-state laser apparatus further comprises a lens 72 for collecting excitation light emitted from the semiconductor laser device 71, a solid-state laser crystal 73 in which laser emission is performed by the collected excitation light, and an output mirror 74, consisting of a concave mirror, which forms a solid-state laser resonator along with the solid-state laser crystal 73. The solid-state laser crystal 73 has a coating 76 on the semiconductor laser device side. The coating 76 is highly reflective with respect to light emitted from the solid-state laser crystal 73 and is reflectionless with respect to light emitted from the semiconductor laser device 71. The solid-state laser resonator is formed by the output mirror 74, which consists of a concave mirror, and the coating 76. Within the resonator, there is provided a KNbO3 non-linear crystal 75 for reducing the wavelength of the laser light emitted from the solid-state laser crystal 73 to one half and then generating a second harmonic. Note that the solid-state laser crystal 73 may employ Nb:YVO$_4$, etc. Also, the nonlinear crystal 75 may employ KTP, etc. The temperatures of the semiconductor laser device 71, the solid-state laser crystal 73, and the non-linear crystal 75 are controlled by a Peltier element (not shown).

In the solid-state laser apparatus of the present invention, automatic power control (APC) is performed. That is, part of the emitted light is received by a light-receiving element 78 through a beam splitter 77 and is fed back to the semiconductor laser device 71 so that the light intensity stays constant.

The semiconductor laser device of the present invention can be used as an array-type semiconductor laser device in addition to the excitation light source of the solid-state laser apparatus of the present invention, and can be mounted on an integrated circuit, etc.

The semiconductor laser device and the solid-state laser apparatus of the present invention are capable of emitting laser light whose reliability is high from a low output to a high output. Because of high reliability, they can be used in array-type semiconductor lasers and integrated circuits. In addition, they are applicable as light sources in many areas of high-speed information and image processing, optical communication, optical measuring, medical treatment, and laser printing.

While the present invention has been described with reference to the preferred embodiments thereof, the invention is not to be limited to the details given herein, but may be modified within the scope of the invention hereinafter claimed.

What is claimed is:

1. A semiconductor laser device comprising:
   a substrate, a semiconductor layer including an active layer, a cladding layer, and a contact layer stacked in the recited order;
   two exposed portions having a depth at which said semiconductor layer is exposed continuously from one of two resonator end faces to the other; and
   a ridge portion, formed between said two exposed portions, which has a current injection window formed in a top surface of said ridge portion;
   wherein in at least one of the resonator end faces of said ridge portion, a portion of said contact layer near said one resonator end face is removed;
   an insulating film is formed so that it covers a region, excluding said current injection window, of said contact layer, and portions of said cladding layer exposed by removing the portion of said contact layer near said one resonator end face; and
   an electrode is formed on at least a portion of said contact layer exposed to said current injection window.

2. The semiconductor laser device as set forth in claim 1, wherein the uppermost layer of said semiconductor layer in a stacking direction is an etch-stopping layer, said cladding layer is provided on said etch-stopping layer, and a layer exposed to the bottom portions of said two exposed portions is said etch-stopping layer.

3. The semiconductor laser device as set forth in claim 2, wherein said cladding layer comprises AlGaAs and said contact layer comprises GaAs.

4. The semiconductor laser device as set forth in claim 2, wherein said etch-stopping layer comprises InGaP.

5. The semiconductor laser device as set forth in claim 2, wherein said cladding layer comprises AlGaAs, said contact layer comprises GaAs, and said etch-stopping layer comprises InGaP.

6. The semiconductor laser device as set forth in claim 2, wherein another cladding layer is provided underneath said etch-stopping layer, is the same in conductivity and nearly the same in refractive index as said cladding layer, and has a lattice match with respect to said substrate.

7. The semiconductor laser device as set forth in claim 1, wherein said cladding layer comprises AlGaAs and said contact layer comprises GaAs.

8. The semiconductor laser device as set forth in claim 1, wherein a side face of said contact layer exposed to said exposed portion is situated inside an edge of a top surface of said cladding layer exposed to said exposed portion.

9. The semiconductor laser device as set forth in claim 1, wherein the portion of said contact layer near said resonator end face, which is removed, is in a range between 5 μm and 50 μm, from said one resonator end face.

10. A semiconductor laser device comprising:
    two opposite resonator end faces where at least a first conduction type first cladding layer, a first conduction type or i-type first optical waveguide layer, an i-type In$_{x2}$Ga$_{1-x2}$As$_{1-y2}$P$_{y2}$ first barrier layer having tensile strain (where x2/0.49≦y2≦0.3+(x2/0.49), and 0.8≦y2≦1.0), an i-type In$_{x3}$Ga$_{1-x3}$As$_{1-y3}$P$_y$ quantum well active layer (where 0.3≦x3≦0.2 and y3=x3/0.49), an i-type In$_{x2}$Ga$_{1-x2}$As$_{1-y2}$P$_{y2}$ second barrier layer having tensile strain (where x2/0.49≦y2≦0.3+(x2/0.49), and 0.8≦y2≦1.0), a second conduction type or i-type second optical waveguide layer, a second conduction type second cladding layer, a second conduction type contact layer, are stacked on a first conduction type GaAs substrate in the recited order;
    wherein said first cladding layer and said second cladding layer comprise compositions which have a lattice match with respect to said GaAs substrate, respectively;
    said first optical waveguide layer and said second optical waveguide layer comprise compositions which have a lattice match with respect to said GaAs substrate, respectively;
    the total thickness of said first barrier layer and said second barrier layer is between 10 nm and 30 nm;
    said first barrier layer and said second barrier layer have tensile strains with respect to said GaAs substrate, respectively, and comprise a composition in which the product of a tensile strain quantity common to said two barrier layers and said total thickness is between 0.05 nm and 0.2 nm;
    said quantum well active layer comprises a composition which has a lattice match with respect to said GaAs substrate or composition which has a tensile strain of –0.007 with respect to said substrate; and
    a current non-injection region is provided near at least one of said two opposite resonator end faces of said second conduction type contact layer.

11. The semiconductor laser device as set forth in claim 10, wherein
    said current non-injection region is formed by removing at least a portion of said contact layer that is near said one resonator end face;
    an insulating film is formed from the remaining contact layer on said second cladding layer to said second cladding layer exposed to said current non-injection region, a current injection window is formed by removing a portion of said insulating film to inject current; and
    an electrode is formed on a portion of said insulating film other than said current non-injection region so that it covers at least said current injection window.

12. The semiconductor laser device as set forth in claim 11, wherein said contact layer comprises GaAs and said cladding layer has a composition that is not etched by an etchant for GaAs.

13. The semiconductor laser device as set forth in claim 10, wherein said contact layer comprises GaAs and said cladding layer has a composition that is not etched by an etchant for GaAs.

14. The semiconductor laser device as set forth in claim 10, wherein said current non-injection region is formed in a range between 5 μm and 50 μm, from said resonator end face.

15. A solid-state laser apparatus comprising:

an excitation light source; and a solid-state laser crystal for emitting laser light by being excited with excitation light emitted from said excitation light source;

wherein said excitation light source comprises a semiconductor laser device comprising:

a substrate, a semiconductor layer including an active layer, a cladding layer, and a contact layer stacked in the recited order;

two exposed portions having a depth at which said semiconductor layer is exposed continuously from one of two resonator end faces to the other; and a ridge portion, formed between said two exposed portions, which has a current injection window formed in a top surface of said ridge portion;

wherein in at least one of the resonator end faces of said ridge portion, a portion of said contact layer near said one resonator end face is removed;

an insulating film is formed so that it covers a region, excluding said current injection window, of said contact layer, and portions of said cladding layer exposed by removing the portion of said contact layer near said one resonator end face; and an electrode is formed on at least a portion of said contact layer exposed to said current injection window.

16. A solid-state laser apparatus comprising:

an excitation light source; and a solid-state laser crystal for emitting laser light by being excited with excitation light emitted from said excitation light source;

wherein said excitation light source comprises a semiconductor laser device comprising:

two opposite resonator end faces where at least a first conduction type first cladding layer, a first conduction type or i-type first optical waveguide layer, an i-type $In_{x2}Ga_{1-x2}As_{1-y2}P_{y2}$ first barrier layer having tensile strain (where $x2/0.49 \leq y2 \leq 0.3+(x2/0.49)$, and $0.8 \leq y2 \leq 1.0$), an i-type $In_{x3}Ga_{1-x3}As_{1-y3}P_y$ quantum well active layer (where $0.3 \leq x3 \leq 0.2$ and $y3=x3/0.49$), an i-type $In_{x2}Ga_{1-x2}As_{1-y2}P_{y2}$ second barrier layer having tensile strain (where $x2/0.49 \leq y2 \leq 0.3+(x2/0.49)$, and $0.8 \leq y2 \leq 1.0$), a second conduction type or i-type second optical waveguide layer, a second conduction type second cladding layer, a second conduction type contact layer, are stacked on a first conduction type GaAs substrate in the recited order;

wherein said first cladding layer and said second cladding layer comprise compositions which have a lattice match with respect to said GaAs substrate, respectively;

said first optical waveguide layer and said second optical waveguide layer comprise compositions which have a lattice match with respect to said GaAs substrate, respectively;

the total thickness of said first barrier layer and said second barrier layer is between 10 nm and 30 nm;

said first barrier layer and said second barrier layer have tensile strains with respect to said GaAs substrate, respectively, and comprise a composition in which the product of a tensile strain quantity common to said two barrier layers and said total thickness is between 0.05 nm and 0.2 nm;

said quantum well active layer comprises a composition which has a lattice match with respect to said GaAs substrate or composition which has a tensile strain of −0.007 with respect to said substrate; and a current non-injection region is provided near at least one of said two opposite resonator end faces of said second conduction type contact layer.

* * * * *